United States Patent [19]

Tarbouriech

[11] Patent Number: 4,977,541

[45] Date of Patent: Dec. 11, 1990

[54] EPROM PROGRAMMING

[75] Inventor: Jean-Claude Tarbouriech, Ville-La-Grand, France

[73] Assignee: Motorola, Inc., Schaumburg, Ill.

[21] Appl. No.: 363,751

[22] Filed: Jun. 9, 1989

[30] Foreign Application Priority Data

Jun. 17, 1988 [GB] United Kingdom ................ 8814421

[51] Int. Cl.⁵ ............................................. G11C 11/40
[52] U.S. Cl. ............................... 365/189.11; 365/104; 365/185
[58] Field of Search .................. 365/189.11, 185, 226, 365/104, 189.09

[56] References Cited

U.S. PATENT DOCUMENTS 4,761,764  8/1988  Watanabe ...................... 365/185 X
4,811,292  3/1989  Watanabe .......................... 365/185

*Primary Examiner*—Joseph A. Popek
*Attorney, Agent, or Firm*—Charlotte B. Whitaker

[57] ABSTRACT

An EPROM memory transistor programming arrangement is disclosed in which programming voltage for a memory transistor is applied via a load line of series connected N-channel MOS transistors which are controlled by low voltage NAND gate having low voltage address, write select and data inputs, through a high voltage inverter. The arrangement may be implemented entirely by N-channel MOS transistors which enables a compact silicon implementation and requires no separate BVDSS breakdown protection.

9 Claims, 1 Drawing Sheet

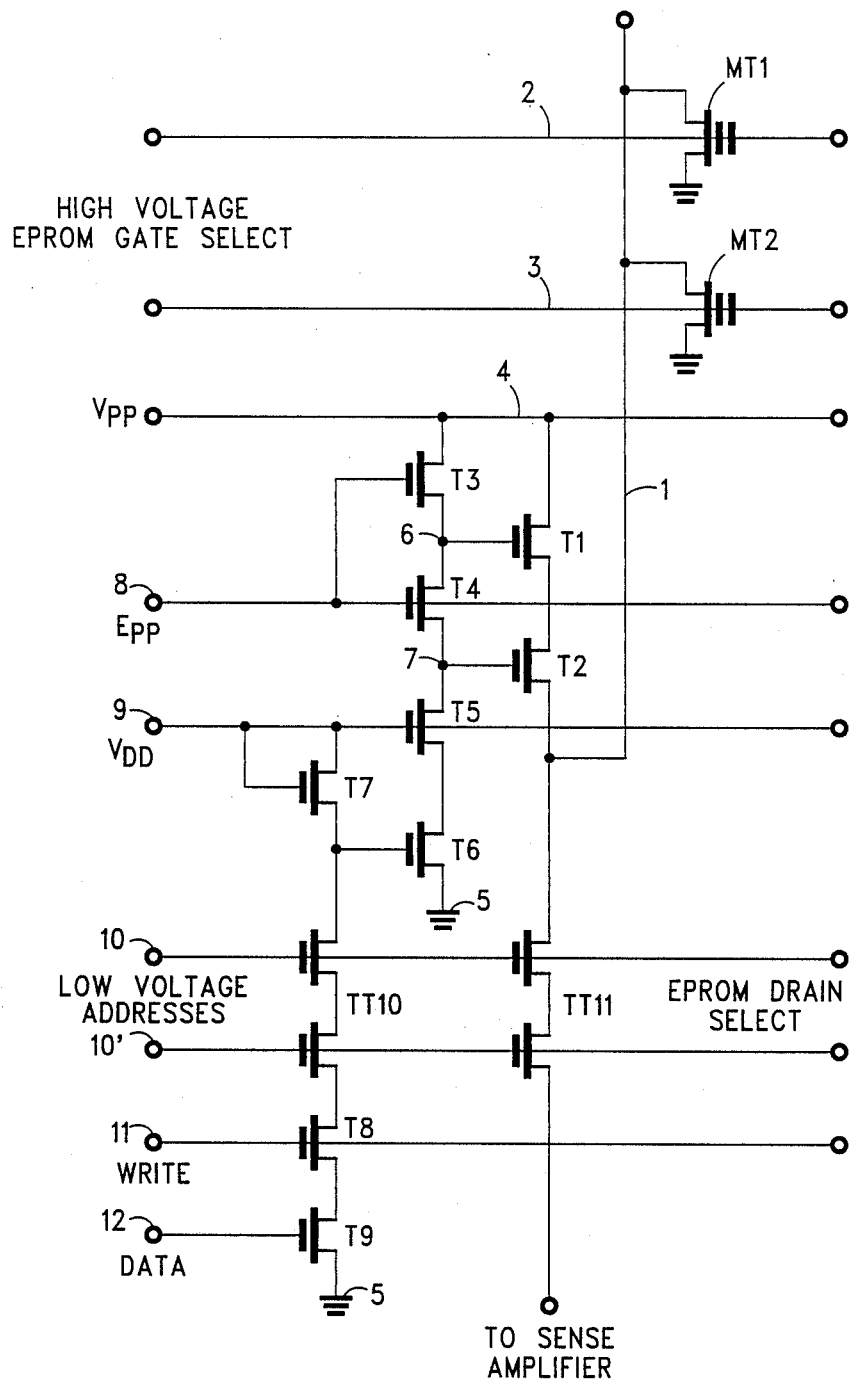

1

EPROM PROGRAMMING

FIELD OF THE INVENTION

This invention relates to an EPROM (Electrically Programmable Read Only Memory) memory transistor programming arrangement.

BACKGROUND OF THE INVENTION

In order to program an EPROM MOS memory transistor, both the gate and drain terminals must be connected to a special high supply voltage VPP, typically 15 volts compared with the typical 5 volts of the normal supply voltage VDD.

In known arrangements the VPP supply voltage is coupled to the drain of the memory transistor via a load line controlled by address lines which include high voltage driver transistors.

The load line control arrangement has been implemented by high voltage CMOS inverters including P-channel and N-channel transistors in which the P-channel transistors require BVDSS breakdown protection. In addition the separation between such P-channel and N-channel transistors in the high voltage section takes up a greater area of silicon, which results in a design which does not have a compact silicon implementation.

This invention seeks to provide a memory transistor programming arrangement which requires only N-channel transistors and in which the above mentioned problems are mitigated.

SUMMARY OF THE INVENTION

In accordance with the invention there is provided an EPROM memory transistor programming arrangement comprising a MOS memory transistor; gate select means for applying gate programming voltage to the gate of the transistor; a load line including first and second MOS transistors coupled in series between a first programming supply line and the drain electrode of the memory transistor; switching logic for selectively applying to the gate electrode of the first and second transistors a programming potential derived from a second programming supply line, and gating logic having a low voltage address input and a data input for controlling the switching logic in dependence upon signals applied to the data and address inputs.

The second programming supply line may be coupled to receive its supply potential from the first programming supply line.

Preferably the second programming supply line is coupled to the first programming supply line at a node, the potential at which is substantially independent of current flow in the first programming supply line.

The switching logic may include a transistor voltage divider comprising third and fourth series connected resistive MOS transistors coupled between the first programming line and the gate electrode of the second transistor, a node between the third and fourth transistors being coupled to the gate electrode of the said first transistor and the gate electrodes of the third and fourth transistors being coupled to the second programming supply line.

The switching logic preferably includes high voltage inverting logic having an input coupled to the output of the gating logic and an output coupled to the gate electrode of the second transistor of the load line.

The high voltage inverting logic may comprise fifth and sixth MOS transistors coupled in series between the gate electrode of the second transistor of the load line and a reference potential, the gate electrode of the fifth transistor being coupled to a supply potential and the gate electrode of the sixth transistor being coupled to the gating logic.

The gate electrode of the sixth transistor is preferably also coupled to the said supply potential by resistive logic typically a MOS resistive pull-up transistor.

The drain electrode of the memory transistor is typically coupled to a sense amplifier via MOS address transistor logic.

BRIEF DESCRIPTION OF THE DRAWING

An exemplary embodiment of the invention will now be described with reference to the single figure drawing which shows a EPROM memory transistor programming arrangement in accordance with the invention.

DETAILED DESCRIPTION OF THE PREFERRED EMBODIMENT

In the drawing there is shown two N-channel MOS memory transistors MT1 and MT2 which form part of one column of a memory array. The drain electrodes of each transistor MT1, MT2, etc in the same column are all coupled to a column supply line 1. The gate electrodes of the memory transistors MT1 and MT2 are coupled to high voltage gate select means formed by supply lines 2 and 3. The gate electrode of the transistor MT1 together with the gate electrodes of other memory transistors in the same row of the array, are connected to the supply line 2, whilst the gate electrode of the memory transistor MT2 and the gate electrodes of others in the same row are connected to the supply line 3.

The column supply line 1 is coupled to a high voltage drain programming supply line 4 by means of a load line formed by two series connected N channel MOS transistors T1 and T2.

Also coupled in series between the supply line 4 and a reference potential line 5 (typically ground reference) is switching means including four N-channel MOS transistors T3, T4, T5 and T6.

The transistors T3 and T4 form a node 6 therebetween, which is coupled to the gate electrode of the load line transistor T1. Similarly a node 7 formed between the transistors T4 and T5 is coupled to the gate electrode of the second load line transistor T2.

The gate electrode of the transistors T3 and T4 are both coupled to a supply line 8 to which is applied a potential EPP derived from the VPP supply line at a node close to and having low resistance to the VPP supply pad and thus is equal to VPP but is substantially unaffected by voltage drops due to the drawing of heavy programming current from the VPP line. The supply line 8 is essentially the same as the lines 2 and 3 which supply the gates of MT1 and MT2 and, since coupled only to transistor gate electrodes, draws substantially no current.

The gate electrode of the transistor T5 is coupled to a supply line 9 having a potential of VDD, whilst the gate electrode of the transistor T6 is coupled to the same supply line 9 by way of an N-channel MOS resistive pull-up transistor T7. The source electrode of T7 is coupled to the gate electrode of the transistor T6 and the gate and drain electrodes are coupled to the supply line 9.

Coupled between the gate electrode of the transistor T6 and ground reference line 5 is low voltage gating means formed by series connected N-channel MOS address selection transistors TT10, and transistors T8 and T9. Each of the address selection transistors TT10 has its gate electrode coupled to low voltage address lines 10 and 10, the gate electrode of the transistor T8 is coupled to a write enable line 11 and the gate electrode of the transistor T9 is coupled to a data input line 12.

Finally, the column supply line 1 is coupled, for reading purposes, to a sense amplifier via N-channel MOS address selection transistors TT11, whose gate electrodes are coupled to the low voltage address lines.

In operation a first programming voltage VPP, typically 15V is applied to the supply line 4. A second programming voltage EPP, also typically 15V is applied to the supply line 8 and a standard supply rail voltage VDD, typically 5V is applied to the supply line 9.

The low voltage gating means formed by the transistors TT10, T8 and T9 acts as a NAND gate, so that if the low voltage address lines 10, the write select input 11 and the data applied to data input 12 are all high, a conductive path will exist through those transistors and the output of the NAND gate formed at the gate electrode of the transistor T6 will be low due to the resistive nature of T7.

The transistor T6 will be turned off and the gate electrodes of the load line transistors T1 and T2 will rise to a voltage of EPP-VTN (VTN equals the threshold voltage of an N-channel transistor). The transistors T5 and T6 thus act as high voltage inverter whose high voltage output at the gate of the transistor T is high when its low voltage input at the gate of the transistor T6 is low and vice versa.

The maximum voltage which can be applied to the column supply line 1 and hence to the drain electrode of the memory transistors MT1 and MT2 is thus EPP-2VTN. This voltage can be selected by choosing the value of EPP so that the memory transistors will not go into breakdown. Typically EPP is chosen to be equal to VPP and is derived from the VPP supply.

If several bits (from different columns) are programmed at once, considerable current is drawn on VPP supply line 4 and a resistive voltage drop accross the line 4 protective resistor would reduce the value of the drain programming voltage.

Preferably therefore in the invention EPP is derived from the VPP supply line at a node close to and having a low resistance to the supply pad at which the VPP voltage is applied.

EPP will thus not be affected by any voltage drop since no D.C. current is drawn on the EPP supply line 8 which is only connected to transistor gates. Also, provided the VPP voltage drop is less than 2VTN the maximum drain programming voltage will not be affected. Programming drain current is controlled by the sizing of the load line transistors T1 and T2.

If the data to be written into a selected bit is zero there is no current through the transistors TT10, T8 and T9 of the NAND gate and its output at the gate of T6 is pulled up to VDD-VTN by the resistive pull-up T5. The transistor T6 conducts.

The transistors T3 and T4 are very resistive so that the gate of transistor T2 is brought below VTN and turns off completely. In the absence of transistor T1, the transistor T2 would enter so-called BVDSS breakdown because its drain would be at VPP and its gate close to ground. However, the transistors T3 and T4 form a resistive voltage divider between the VPP line 4 and the gate electrode of T2, with the node 6 formed between T3 and T4 coupled to the gate electrode of the transistor T1. Consequently a voltage VPP/2 is applied to the gate electrode of T1. This increases the BVDSS breakdown voltage of T1 above the value of VPP and reduces the voltage of the drain electrode of T2 to VPP/2-VTN.

Similarly, the transistor T5 having a voltage VDD on its gate electrode, protects the transistor T6.

In order to read a written bit the read select transistors TT11 are coupled between the column line 1 and a sense amplifier and are enabled by means of low voltage address signals on the address lines 10 and 10.

The low voltage address read select transistors TT11 also act to protect the sense amplifier from high voltages. Since the gates of TT10 and TT11 are tied together, both have the low address select voltage VDD on their gates and the maximum voltage passed to the sense amplifier is VDD-VTN and the transistors are also protected against BVDSS breakdown.

In the read mode the EPP voltage on line 8 is also switched low and the write select transistor is turned off so that no D.C. current flows in the entire load line arrangement.

The programming arrangement of the invention provides several important advantages. Since the memory and programming circuit may be implemented entirely in N-channel transistors a very compact silicon structure is achieved. No high voltage p-channel transistors with associated BVDSS protection are required and no high voltage drivers are needed for the address lines. Drain programming voltage is made substantially independent of the total programming current, i.e. of the voltage drop across the VPP line 4. Finally, there is no D.C. current consumption in the Read mode which is important for HCMOS applications.

Modifications may be made without departing from the scope of the invention. For example although the second programming potential EPP has been derived from the first programming potential VPP, it may be supplied on a different pin/pad to VPP.

Although illustrated in respect of programming a single column of a memory array, for multiple columns, each column will be driven by its own load line identical to T1 and T2 the load line being controlled by a corresponding switching means and controlling gating means.

I claim:

1. An EPROM memory transistor programming arrangement comprising a MOS memory transistor; gate select means for applying gate programming voltage to a gate of the transistor; a load line including a first and a second MOS transistor coupled in series between a first programming supply line and a drain electrode of the memory transistor; switching means for selectively applying to a gate electrode of the first and second transistors a programming potential derived from a second programming supply line, and gating means having a low voltage address input and a data input for receiving an address signal, and a data signal, and for providing an output control signal to the switching means in response thereto.

2. The arrangement of claim 1 wherein the second programming supply line is coupled to receive a supply potential derived from said first programming supply line.

3. The arrangement of claim 2 wherein the second programming supply line is coupled to the first programming supply line at a node the supply potential at which is substantially independent of current flow in the first programming supply line.

4. The arrangement of claim 1 claim wherein the switching means includes a transistor voltage divider comprising a third transistor and a fourth transistor, said third and said fourth transistors being series connected resistive MOS transistors coupled between the first programming line and the gate electrode of the second transistor, a node between said third and said fourth transistors being coupled to the gate electrode of said first transistor, and the gate electrodes of said third and said fourth transistors being coupled to the second programming supply line.

5. The arrangement of claim 1 wherein the switching means includes high voltage inverting means having an input coupled to the output of the gating means and an output coupled to the gate electrode of the second transistor of the load line.

6. The arrangement of claim 5 wherein the high voltage inverting means comprises a fifth and a sixth MOS transistors coupled in series between the gate electrode of the second transistor of the load line and a reference potential, the gate electrode of the fifth transistor being coupled to a supply potential and the gate electrode of the sixth transistor being coupled to the gating means.

7. The arrangement of claim 6 wherein the gate electrode of the sixth transistor is also coupled to said supply potential by resistive means.

8. The arrangement of claim 7 wherein the resistive means is a MOS resistive pull-up transistor.

9. The arrangement of claim 1 wherein the drain electrode of the memory transistor is coupled to a sense amplifier via MOS address selection means.

* * * * *